United States Patent
Xiong et al.

(10) Patent No.: US 8,507,808 B2
(45) Date of Patent: Aug. 13, 2013

(54) SHIELDING ASSEMBLY AND METHOD FOR MANUFACTURING SAME

(75) Inventors: Li-Zhi Xiong, Shenzhen (CN); Liang Su, Shenzhen (CN); Wen-Jun Liu, Shenzhen (CN); Cheng-Rui Liu, Shenzhen (CN); Jun-Sheng Qiao, Shenzhen (CN); Pei-Chin Kuo, Shindian (TW)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 363 days.

(21) Appl. No.: 13/037,482

(22) Filed: Mar. 1, 2011

(65) Prior Publication Data

US 2012/0145449 A1 Jun. 14, 2012

(30) Foreign Application Priority Data

Dec. 9, 2010 (CN) .......................... 2010 1 0580528

(51) Int. Cl.
*H05K 9/00* (2006.01)
*H05K 7/18* (2006.01)
*B21D 39/00* (2006.01)

(52) U.S. Cl.
USPC ........... 174/377; 174/350; 174/383; 361/800; 361/816; 361/818; 29/512

(58) Field of Classification Search
USPC ................. 174/350, 377, 383, 385; 361/800, 361/816, 818; 29/512
See application file for complete search history.

(56) References Cited

U.S. PATENT DOCUMENTS

| | | | | |
|---|---|---|---|---|
| 5,742,488 A | * | 4/1998 | Lonka et al. | 361/816 |
| 5,928,076 A | * | 7/1999 | Clements et al. | 454/184 |
| 7,492,610 B2 | * | 2/2009 | Gilliland | 361/818 |
| 2009/0084705 A1 | * | 4/2009 | Justiss | 206/724 |
| 2011/0299263 A1 | * | 12/2011 | Pai et al. | 361/818 |

* cited by examiner

*Primary Examiner* — Timothy Thompson
*Assistant Examiner* — Sherman Ng
(74) *Attorney, Agent, or Firm* — Altis Law Group, Inc.

(57) ABSTRACT

A shielding assembly includes a frame including a main body, the main body defining at least one retaining hole; and a cover including a main board, the main panel including retaining elements and rims. The number of the retaining elements is the same as the number of the retaining holes, each rim protruding outwardly from a distal end of one of retaining elements. Each retaining element passes through one of the retaining holes, and each rim is latched with the portions of the frame surrounding the retaining holes.

8 Claims, 3 Drawing Sheets

SHIELDING ASSEMBLY AND METHOD FOR MANUFACTURING SAME

BACKGROUND

1. Technical Field

This disclosure relates to shielding assemblies and methods for manufacturing the shielding assemblies, particularly to a shielding assembly for portable electronic devices.

2. Description of Related Art

A typical portable electronic device, such as a mobile phone, generally includes a printed circuit board with one or more electrical components and a shielding assembly mounted to the printed circuit board to shield the electrical components from atmospheric EMI. The shielding assembly generally includes a frame and a cover. To mount the cover to the frame, the cover is typically welded to the frame by some additional device. Thus, to assemble the shielding assembly is complicated and can be expensive.

Therefore, there is a room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary shielding assembly and method for manufacturing the shielding assembly. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
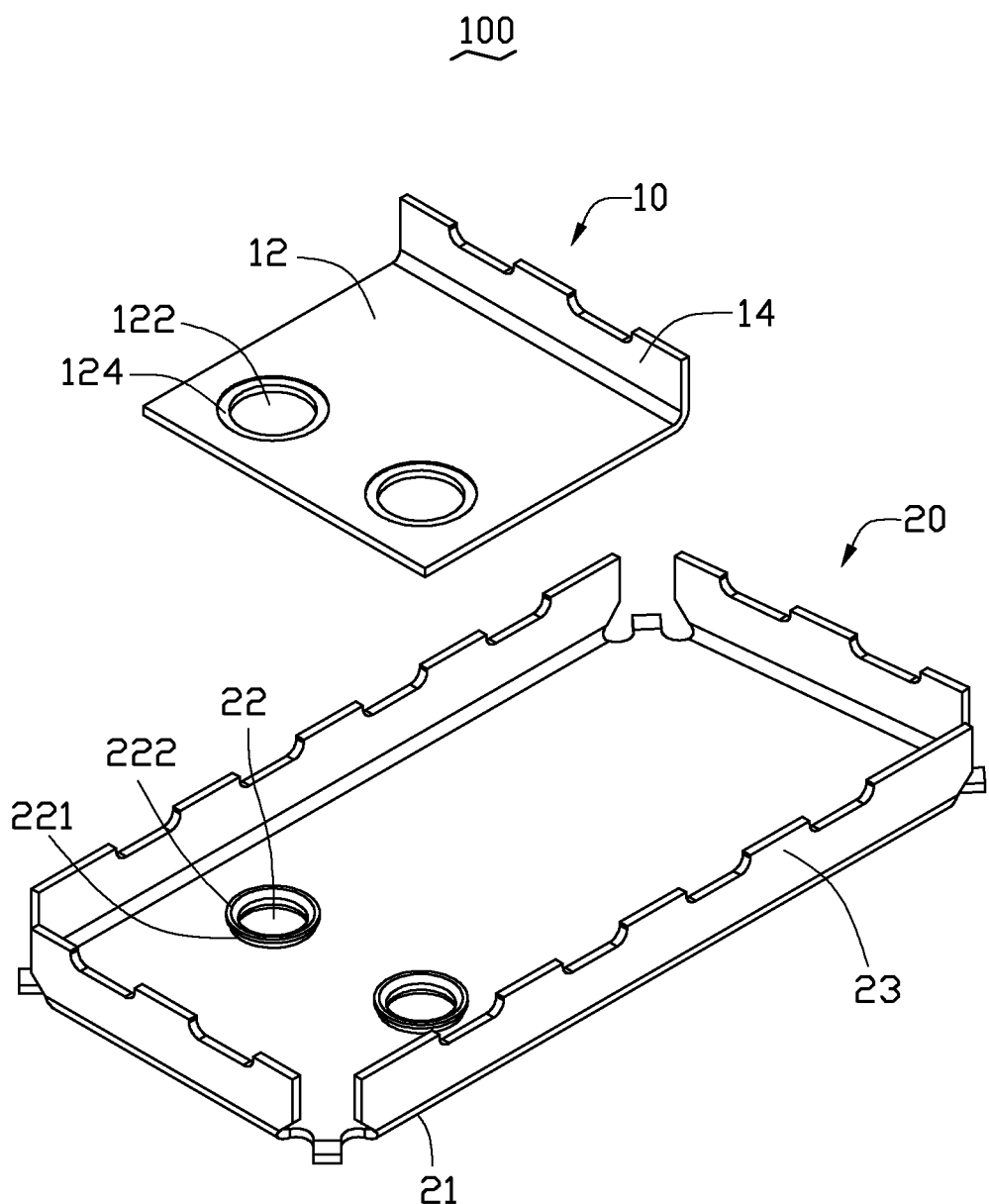
FIG. 1 is an exploded view of an exemplary embodiment of a shielding assembly.
Figure 2:
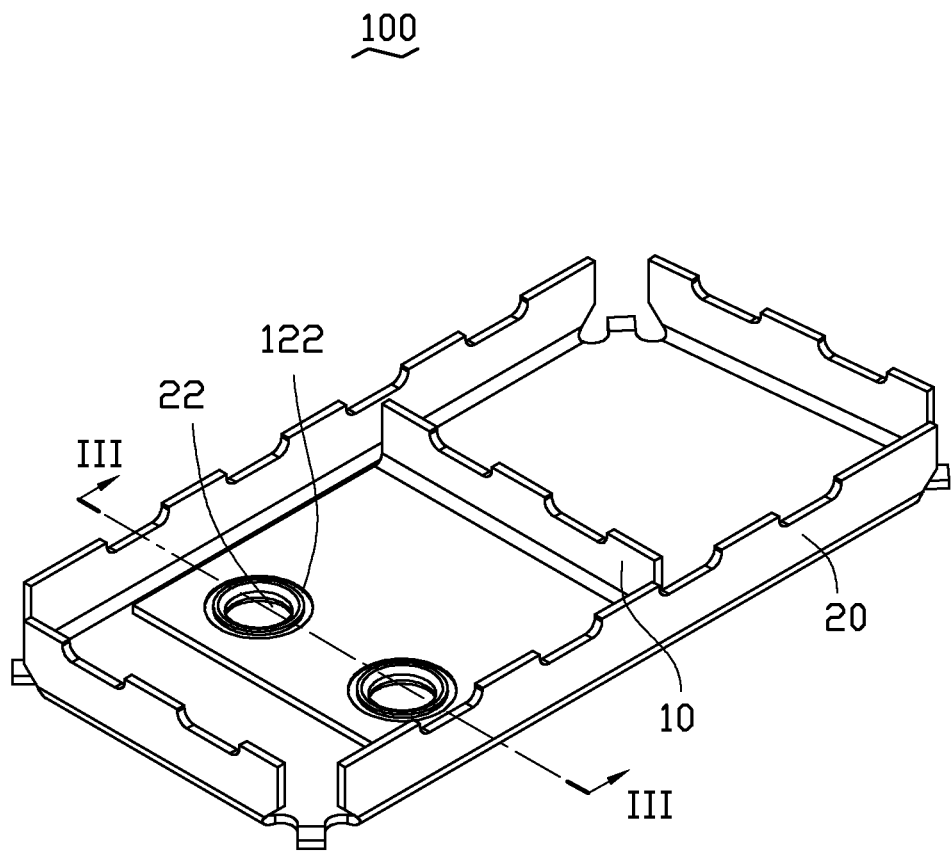
FIG. 2 is an assembled view of the shielding assembly in FIG. 1.
Figure 3:
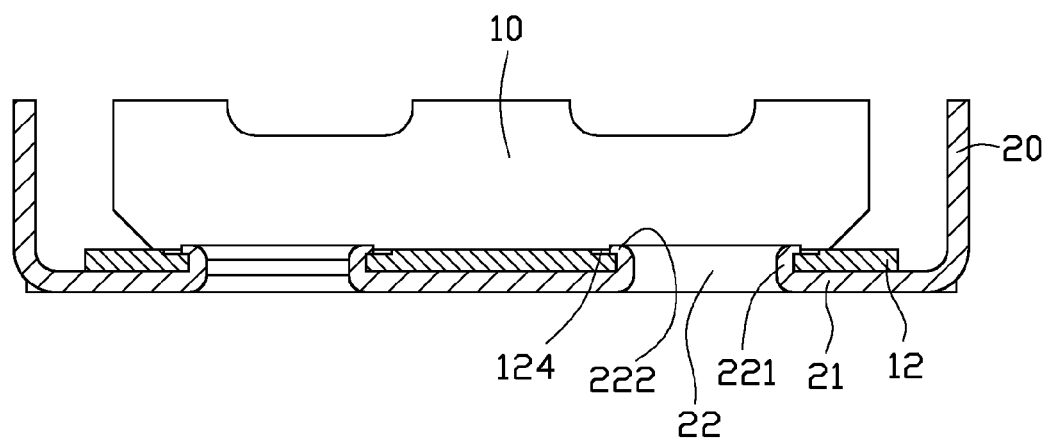
FIG. 3 is a cross-sectional view of the shielding assembly shown in FIG. 2 along the line

Referring to FIGS. 1-3, a shielding assembly 100 includes a frame 10 and a cover 20 latched to the frame 10. The frame 10 may be mounted to a circuit board of an electronic device (not shown), for accommodating electrical components of the electronic device. The frame 10 may be formed by punching a piece of sheet metal. In this exemplary embodiment, the frame 10 is substantially L-shaped, and includes a main body 12 and a sidewall 14 protruding from the main body 12. The main body 12 defines retaining holes 122 and retaining grooves 124, and each retaining groove 122 surrounds and communicates with one of the retaining holes 124.

The cover 20 includes a main panel 21 and a peripheral panel 23 protruding from an edge of the main panel 21. The main panel 21 includes openings 22, retaining elements 221 and rims 222, and the number of the openings 22 is same as the number of the retaining holes 122. Each retaining element 221 surrounds one of the opening 22, and each rim 222 protruding outwardly from a distal end of one of retaining elements 221. Referring to FIG. 3, each retaining element 221 passes through one of the retaining holes 122, and each rim 222 is latched in one of the retaining grooves 124 so the cover 20 is latched to the frame 10 and a cavity defined in the cover 20 is thereby separated into two sub-cavities by the sidewall 14. In this exemplary embodiment, each retaining element 221 is tubular, and each rim 222 is located at and surrounds a distal end of one of the retaining element 221.

Referring to FIGS. 1 to 3, a method for manufacturing the shielding assembly 100 may include at least the following steps.

Providing and punching a first metal plate to form a frame 10, which defines retaining holes 122 and retaining grooves 124. Each retaining groove 124 surrounds and communicates with one of the retaining holes 122.

Providing and punching a second metal plate to form a cover 20, which includes openings 22 and retaining elements 221, the number of the openings 22 is same as the number of the retaining holes 122. Each retaining element 221 surrounds one of the openings 22.

Each retaining element 221 passes through one of the retaining holes 122.

Punching distal ends of the retaining elements 221 to form the rims 222 latched with the portions of the frame 10 surrounding the retaining holes 122, in this exemplary embodiment, the rims 222 are latched in the retaining grooves 124.

In this exemplary embodiment, each rim 222 is latched in one of the retaining grooves 124 so the cover 20 can be latched to the frame 10. Thus, the cover 20 does not need to be welded to the frame 10 with an additional device, so the cost of making the shielding assembly 100 can be reduced.

It is to be further understood that even though numerous characteristics and advantages of the exemplary embodiments have been set forth in the foregoing description, together with details of structures and functions of various embodiments, the disclosure is illustrative only, and changes may be made in detail, especially in matters of shape, size, and arrangement of parts within the principles of the exemplary disclosure to the full extent indicated by the broad general meaning of the terms in which the appended claims are expressed.

What is claimed is:

1. A shielding assembly, comprising:
   a frame including a main body and a sidewall protruding from the main body, the main body defining at least one retaining hole; and
   a cover including a main panel, the main panel including retaining elements and rims, each rim protruding outwardly from a distal end of one the retaining elements;
   wherein each retaining element passes through one of the retaining holes, each rim is latched with the portions of the frame surrounding the retaining holes, and a cavity defined in the cover is thereby separated into two sub-cavities by the sidewall.

2. The shielding assembly claimed in claim 1, wherein the main body further defines at least one retaining grooves, and each retaining groove surrounds and communicates with one of the retaining holes, each rim is latched in one of the retaining grooves.

3. The shielding assembly claimed in claim 1, wherein each retaining element is tubular.

4. The shielding assembly claimed in claim 3, wherein each rim surrounds a distal end of one of the retaining element.

5. A method of manufacturing a shielding assembly, the method comprising:
   forming a frame by providing and punching a first metal plate, to define at least one retaining hole;
   forming a cover by providing and punching a second metal plate to include at least one retaining element, and the number of the retaining element being the same to the number of the retaining hole;
   each retaining element passing through one of the retaining holes;

punching distal end of each retaining elements to form a rim at the distal end of each retaining element, each rim latched with a portion of the frame surrounding one of the retaining holes.

6. The method claimed in claim 5, wherein the frame defines at least one retaining groove, each of which surrounds and communicates with one of the retaining hole; each rim latches with one of the retaining grooves.

7. The method claimed in claim 5, wherein each retaining element is tubular.

8. The method claimed in claim 7, wherein each rim is located at and surrounds a distal end of one of the retaining element.

\* \* \* \* \*